United States Patent
Won et al.

(10) Patent No.: US 10,392,534 B2
(45) Date of Patent: Aug. 27, 2019

(54) ADHESIVE FILM, FOLDABLE DISPLAY DEVICE USING THE SAME, AND METHOD OF MANUFACTURING A FOLDABLE DISPLAY DEVICE

(71) Applicant: LG Display Co., Ltd., Seoul (KR)

(72) Inventors: Yu-Lim Won, Incheon (KR); Se-Jin Jang, Paju-si (KR); Young-Joo Park, Busan (KR); Suk Choi, Hwaseong-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/857,883

(22) Filed: Dec. 29, 2017

(65) Prior Publication Data

US 2018/0187051 A1    Jul. 5, 2018

(30) Foreign Application Priority Data

Dec. 30, 2016  (KR) ........................ 10-2016-0184480

(51) Int. Cl.
| | |
|---|---|
| *G06F 1/16* | (2006.01) |
| *H05K 5/00* | (2006.01) |
| *H05K 7/00* | (2006.01) |
| *C09J 7/38* | (2018.01) |
| *G09F 9/30* | (2006.01) |
| *H01L 51/52* | (2006.01) |
| *H01L 51/00* | (2006.01) |
| *C09J 7/10* | (2018.01) |
| *H01L 27/32* | (2006.01) |

(52) U.S. Cl.
CPC ................ *C09J 7/385* (2018.01); *C09J 7/10* (2018.01); *G06F 1/1641* (2013.01); *G06F 1/1652* (2013.01); *G09F 9/301* (2013.01); *H01L 51/0097* (2013.01); *H01L 51/5246* (2013.01); *C09J 2201/40* (2013.01); *C09J 2203/318* (2013.01); *C09J 2433/00* (2013.01); *G09G 2380/02* (2013.01); *H01L 27/323* (2013.01); *H01L 2251/5338* (2013.01); *H01L 2251/558* (2013.01)

(58) Field of Classification Search
CPC ...... G06F 1/1652; G06F 1/1641; C09J 7/385; C09J 7/30; C09J 7/38; C09J 7/381; C09J 7/10; C09J 7/00; H01L 51/0097; H01L 51/5246
USPC ........................................ 361/679.01, 679.02
See application file for complete search history.

(56) References Cited

U.S. PATENT DOCUMENTS

| | | | |
|---|---|---|---|
| 2013/0065122 A1* | 3/2013 | Chiang | H01M 4/0478 429/211 |
| 2016/0046095 A1* | 2/2016 | Clough | E04B 1/86 181/286 |
| 2017/0010720 A1* | 1/2017 | Nakayama | G06F 3/044 |
| 2017/0080673 A1* | 3/2017 | Schaedler | B32B 3/12 |
| 2018/0074553 A1* | 3/2018 | Yamazaki | G09F 9/00 |

* cited by examiner

*Primary Examiner* — Anthony M Haughton
(74) *Attorney, Agent, or Firm* — Morgan, Lewis & Bockius LLP

(57) ABSTRACT

An adhesive film, a foldable display device using the same, and a method of manufacturing a foldable display device are provided. An adhesive film includes: a frame including a micro-truss structure, the micro-truss structure including a plurality of unit cells including a plurality of wires intersecting each other in a three-dimensional space, and an adhesive filling the frame.

15 Claims, 10 Drawing Sheets

FIG. 1B
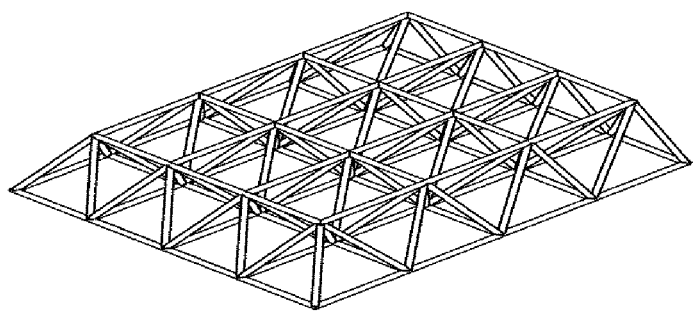
(a)
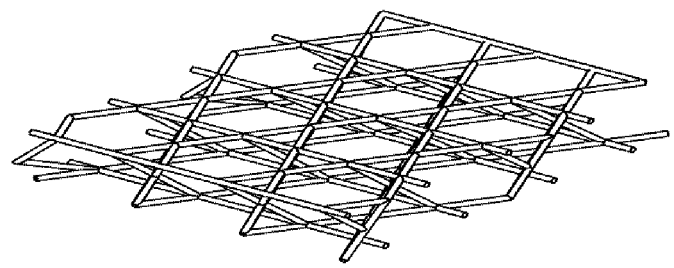
(b)
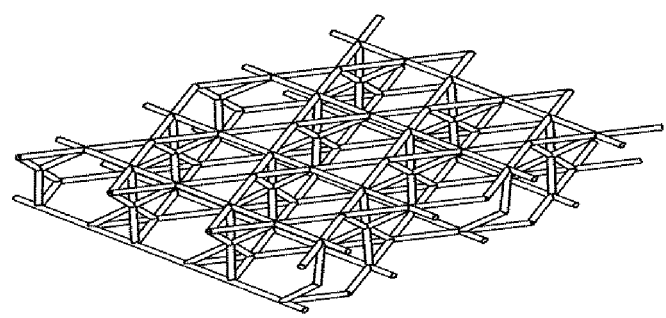
(c)

FIG. 3
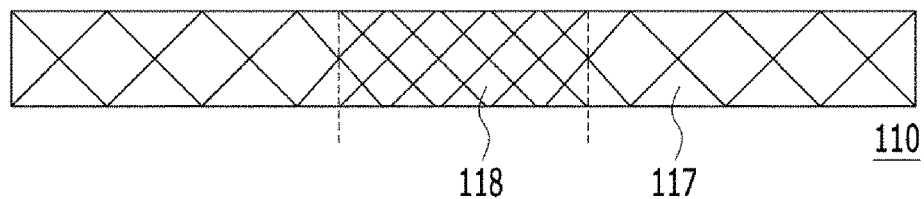
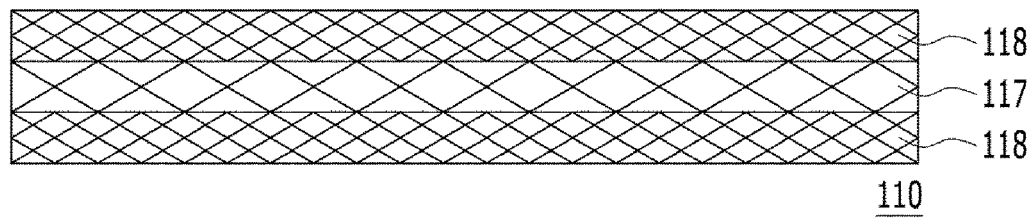

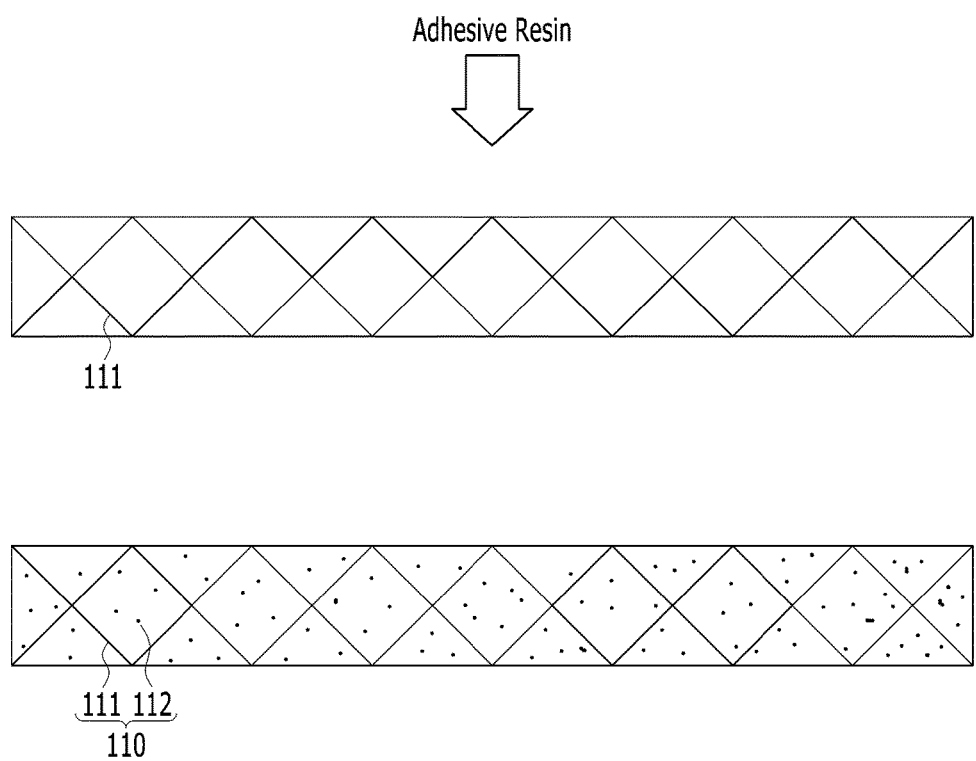

ADHESIVE FILM, FOLDABLE DISPLAY DEVICE USING THE SAME, AND METHOD OF MANUFACTURING A FOLDABLE DISPLAY DEVICE

CROSS-REFERENCE TO RELATED APPLICATIONS

This application claims the priority of Korean Application No. 10-2016-0184480, filed on Dec. 30, 2016, the entirety of which is hereby incorporated by reference.

BACKGROUND

1. Technical Field

The present disclosure relates to an adhesive film and a foldable display device using the same, and more particularly, to an adhesive film having a shock-resistant structure and a foldable display device using the same, and a method of manufacturing a foldable display device.

2. Discussion of the Related Art

Image display devices, which are a core technology in the information and communication age, for displaying various kinds of information on a screen have been developed such that the image display devices are thinner, lighter, and portable and exhibit high performance. In addition, organic light-emitting display devices, which control the amount of light that is emitted from an organic light-emitting layer to display an image, have been highlighted as flat panel display devices, which have lower weight and volume than cathode ray tubes (CRT).

In an organic light-emitting display device, a plurality of pixels is arranged in the form of a matrix to display images. Each pixel includes a light-emitting device, and the organic light-emitting display device includes a pixel drive circuit including a plurality of transistors configured to independently drive the respective light-emitting devices.

Using a self-emitting organic light-emitting device, an organic light-emitting display device does not need an additional light source, and may be realized as an ultra-thin display device. In recent years, therefore, research has been actively conducted into an in-cell touch type foldable display device, which uses an organic light-emitting device and includes a touch electrode array in a light-emitting cell.

A foldable display device includes a flexible substrate, rather than a hard substrate (e.g., glass). The flexible substrate is easily deformed, for example, curved by external shocks. Furthermore, the magnitude of shocks that the flexible substrate is capable of absorbing is small. When shocks are applied to the foldable display device, therefore, the shocks are directly transmitted to a display panel, and thus can cause damage to elements provided in the display panel. To commercialize the foldable display device, which exhibits low shock resistance, it is necessary to improve the shock resistance of the foldable display device. Consequently, much research has been conducted into improvements in the shock resistance of the foldable display device.

Meanwhile, a related art adhesive film used in display devices has low rigidity and hardness. As a result, external shocks are directly transmitted to the display panel via the adhesive film. In a general display device, external shocks may be absorbed by a substrate and a cover glass, even when such a related art adhesive film is used. In the foldable display device, however, it is necessary for the adhesive film to exhibit desired shock resistance.

SUMMARY

Accordingly, the present disclosure is directed to an adhesive film, a foldable display device using the same, and a method of manufacturing a foldable display device that substantially obviate one or more of the issues due to limitations and disadvantages of the related art.

An aspect of the present disclosure is to provide an adhesive film having a shock-resistant structure and a foldable display device using the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an adhesive film, including: a frame including a micro-truss structure, the micro-truss structure including a plurality of unit cells including a plurality of wires intersecting each other in a three-dimensional space, and an adhesive filling the frame.

In another aspect, there is provided a foldable display device, including: a display panel including: at least one folding area, and at least one non-folding area, a cover window laminated to an upper side of the display panel, a back plate laminated to a lower side of the display panel, a first adhesive film laminating the display panel to the back plate, and a second adhesive film laminating the display panel to the cover window, wherein at least one of the first and second adhesive films includes: a frame including a micro-truss structure, the micro-truss structure including a plurality of unit cells including a plurality of wires intersecting each other in a three-dimensional space, and an adhesive filling the frame.

In another aspect, there is provided a method of manufacturing a foldable display device, the method including: providing a display panel including: providing at least one folding area, and providing at least one non-folding area, laminating a back plate to a lower side of the display panel with a first adhesive film, laminating a cover window to an upper side of the display panel with a second adhesive film, wherein at least one of the first and second adhesive films includes: a frame including a micro-truss structure, the micro-truss structure being including a plurality of unit cells formed by a plurality of wires intersecting each other in a three-dimensional space, and an adhesive filling the frame.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification.

FIG. 1B shows examples of the structure of a unit cell of the adhesive film of FIG. 1A.

FIG. 3 is a side view illustrating a frame including a high-density part and low-density parts.

FIGS. 4 and 5 are views illustrating a method of forming an adhesive film according to an embodiment of the present disclosure.

Figure 1A:
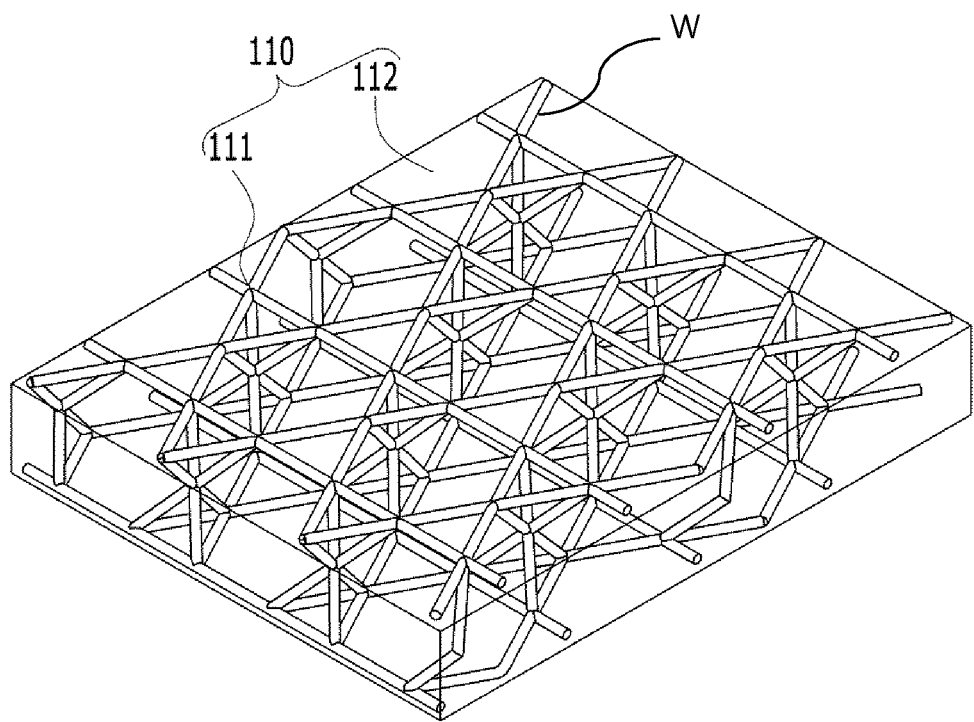
FIG. 1A is a perspective view illustrating an adhesive film according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

FIG. 1A is a perspective view illustrating an adhesive film according to an embodiment of the present disclosure. FIG. 1B shows examples of the structure of a unit cell of the adhesive film of FIG. 1A.

An adhesive film 110 according to an embodiment of the present disclosure may include a frame 111 and an adhesive 112. The frame 111 may be formed to have a three-dimensional micro-truss structure in which unit cells U may be connected to each other. Each of the unit cells U constituting the frame 111 may be formed by arranging micro-scale wires W, each of having a thickness of several μm and a length of tens to hundreds of μm, to intersect each other at one point in a three-dimensional space.

The adhesive 112 may be formed from a material, such as epoxy resin, acrylic resin, silicone resin, ethylene vinyl acetate (EVA) resin, and/or polyethylene (PE) resin. The adhesive 112 may fill the space in the frame 111. The adhesive film 110 including the frame 111 may be formed to have a thickness of 20 to 200 μm. Consequently, the adhesive film 110 may also serve as a shock absorber.

The frame 111 having the micro-truss structure shown in the FIG. 1A example may exhibit high strength while being lightweight, such that the adhesive film 110 may exhibit high shock resistance. In addition, the space in the frame 111 may be filled with the adhesive 112, such that the adhesive film 110 may have adhesive force.

The frame 111 having the three-dimensional truss structure may be formed to have a pyramid truss structure, in which the unit cells U are formed in a pyramid shape, as shown in the example of part (a) of FIG. 1B; an octet truss structure, in which a regular tetrahedron is attached to one surface of a regular octahedron, as shown in the example of part (b) of FIG. 1B; a Kagome truss structure, in which the unit cells U are formed in the shape of a tetrahedron, as shown in the example of part (c) of FIG. 1B; or other similar structures. However, embodiments of the present disclosure are not limited thereto. Any structure similar to the truss structure may be used. One of the unit cells U will be described with reference to the FIG. 2 example, in which the Kagome truss structure is shown, by way of example.

Figure 2:
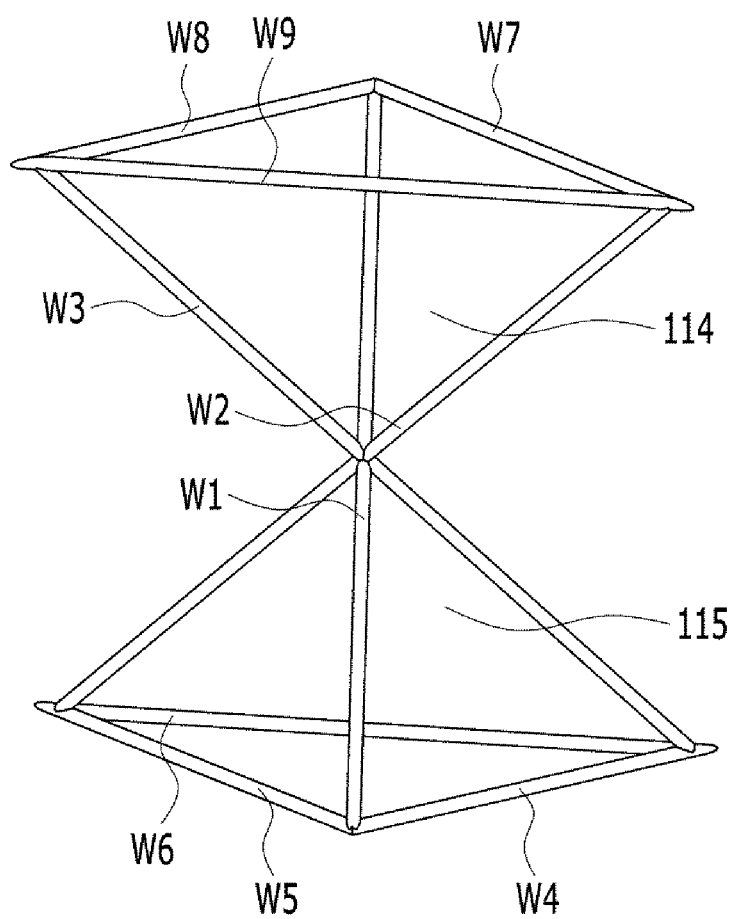
FIG. 2 is a view illustrating the shape of an example unit cell having a Kagome truss structure.

FIG. 2 is a view illustrating the shape of an example unit cell having a Kagome truss structure.

The unit cell U may be formed by arranging wires W to intersect each other. As shown in FIG. 2, for example, the unit cell U may be configured to have a shape in which a first wire W1 arranged in a first direction, a second wire W2 arranged in a second direction, and a third wire W3 arranged in a third direction intersect each other in a three-dimensional space. In addition, the unit cell U may be further provided with a fourth wire W4, a fifth wire W5, and a sixth wire W6, which may form a triangle that connects one-side ends of the first to third wires W1 to W3. The unit cell U may be further provided with a seventh wire W7, an eighth wire W8, and a ninth wire W9, which may be disposed at the other-side ends of the first to third wires W1 to W3. The first to ninth wires W1 to W9 may be formed in the shape of two regular tetrahedrons 114 and 115, the apices of which face each other. Consequently, the unit cell U may have a Kagome truss structure.

The frame 111 may be formed by connecting the unit cells U in a horizontal direction or by connecting the unit cells U in the horizontal direction while stacking the unit cells U in a vertical direction. As described above, each unit cell U may be formed to have various kinds of structures, such as a pyramid truss structure or an octet truss structure, in addition to the Kagome truss structure.

FIG. 3 is a side view illustrating a frame including a high-density part and low-density parts.

In the FIG. 3 example, the structure of the frame 111 is simplified for convenience. However, it should be noted that the unit cells U may have various kinds of truss structures, as described above.

The unit cells U constituting the frame 111 may exhibit higher shock resistance if the unit cells U have higher density. The frame 111 may include a high-density part 118, in which a density of the unit cells U per unit volume is higher at a region having lower resistance to shocks than a density of the unit cells U per unit volume at the remaining region. When the frame 111 includes the high-density part 118, the regions other than the high-density part 118 may be defined as low-density parts 117, in which the density of the unit cells U per unit volume is lower.

With reference to the upper portion of the FIG. 3 example, the high-density part 118 may be provided to extend from the low-density parts 117 in the horizontal direction. High-density parts 118 and low-density parts 117 may be alternately arranged in the horizontal direction to be connected to each other. The high-density part 118 may be provided to support a flexible element of the foldable display panel, such as a folding area, which exhibits low resistance to shocks.

With reference to the lower portion of the FIG. 3 example, high-density parts 118 and a low-density part 117 may be alternately stacked in the vertical direction. For example, the adhesive film 110 may include high-density parts 118 and low-density parts 117, which may be alternately stacked. In the FIG. 3 example, a low-density part 117 is interposed between two high-density parts 118. However, embodiments of the present disclosure are not limited thereto. For example, depending on the design, a high-density part 118 may be interposed between low-density parts 117, or high-density parts 118 and low-density parts 117 may be alternately stacked in the vertical direction to form a plurality of layers. When the high-density parts 118 and the low-density part 117 are stacked in the vertical direction, as described above, one of the high-density parts 118 may be disposed over the adhesive film 110, whereby the overall shock resistance of the adhesive film 110 may be improved.

Figure 4:
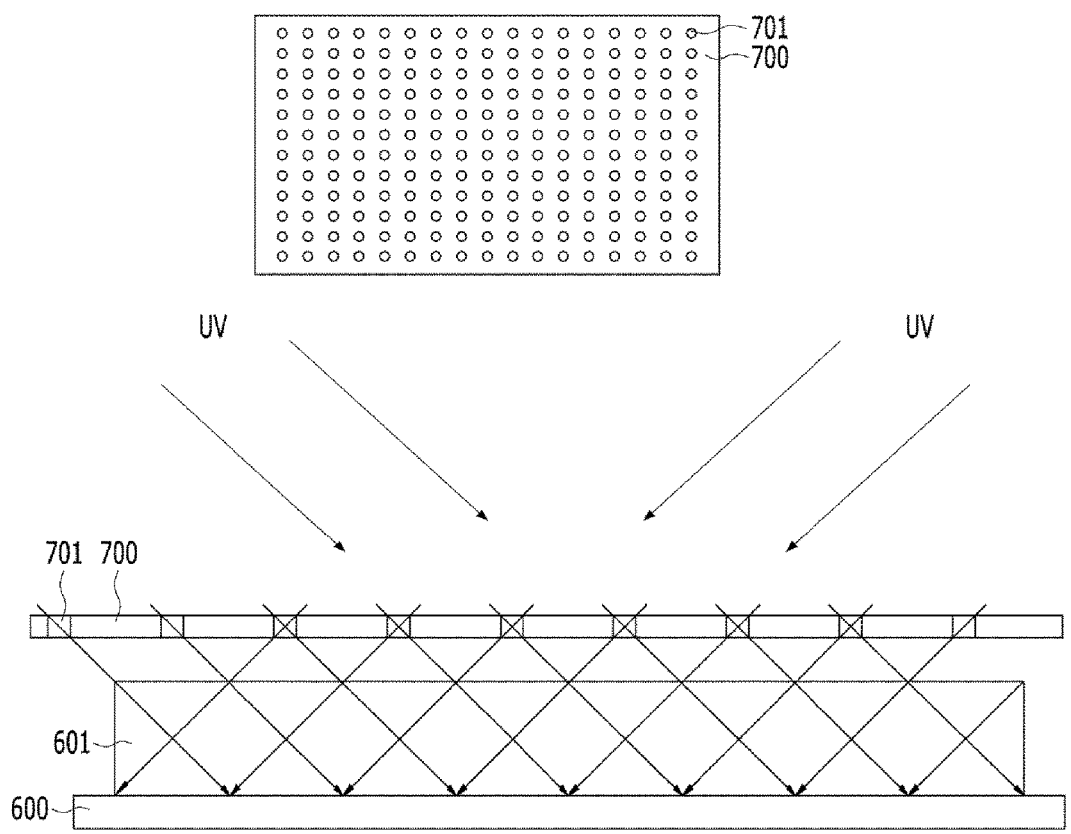

FIGS. 4 and 5 are views illustrating a method of forming an adhesive film according to an embodiment of the present disclosure.

With reference to the FIG. 4 example, a polymer resin 601, including a photo initiator, may be applied to a substrate 600, which may be prepared to form the adhesive film 110. Subsequently, a mask 700 having holes 701, through which light may be selectively transmitted, may be disposed on the polymer resin 601. Subsequently, ultraviolet (UV) rays may be applied to the mask 700 in different directions such that the UV rays may be linearly incident on the polymer resin 601 through the holes 701 in the mask 700 in different directions.

As a result, the portions of the polymer resin 601 through which the linearly incident UV rays are transmitted may be partially hardened to form linear wires W. The wires W may be oriented in different directions, depending on the directions in which the UV rays are applied. The linear wires W may intersect each other to constitute a unit cell U. A plurality of unit cells U may be arranged to form a frame 111 having a micro-truss structure.

With reference to the upper portion of the FIG. 5 example, the frame 111 formed using the method shown in FIG. 4 may be filled with an adhesive 112. As previously described, the adhesive 112 may be formed using various kinds of polymer resins, such as epoxy resin, acrylic resin, silicone resin, ethylene vinyl acetate (EVA) resin, and/or polyethylene (PE) resin. However, embodiments of the present disclosure are not limited thereto. Subsequently, as shown in the lower portion of the FIG. 5 example, an adhesive film 110 having the adhesive 112 filling the frame 111 having the micro-truss structure may be formed.

As previously described, the adhesive film 110 may have sufficient adhesiveness to be applied to a foldable display device. In addition, the adhesive film 110 may serve as a shock absorber for absorbing external shocks because the adhesive film 110 may include the frame 111 having the micro-truss structure. When the adhesive film 110 is applied to a foldable display device, the shock resistance of the foldable display device may be improved.

Meanwhile, to exhibit shock-absorption characteristics, a related art adhesive film made of resin must have a thickness much greater than that of the adhesive film 110 according to an embodiment of the present disclosure. When the adhesive film 110 according to an embodiment of the present disclosure is used, however, the adhesive film 110 may have high shock resistance while the thickness of the adhesive film 110 may be reduced. According to design, the shock resistance of the foldable display device may be improved without an additional shock absorber, whereby the thickness of the foldable display device may be reduced.

Hereinafter, a foldable display device to which the adhesive film 110 according to an embodiment of the present disclosure has been applied will be described.

Figure 6A:
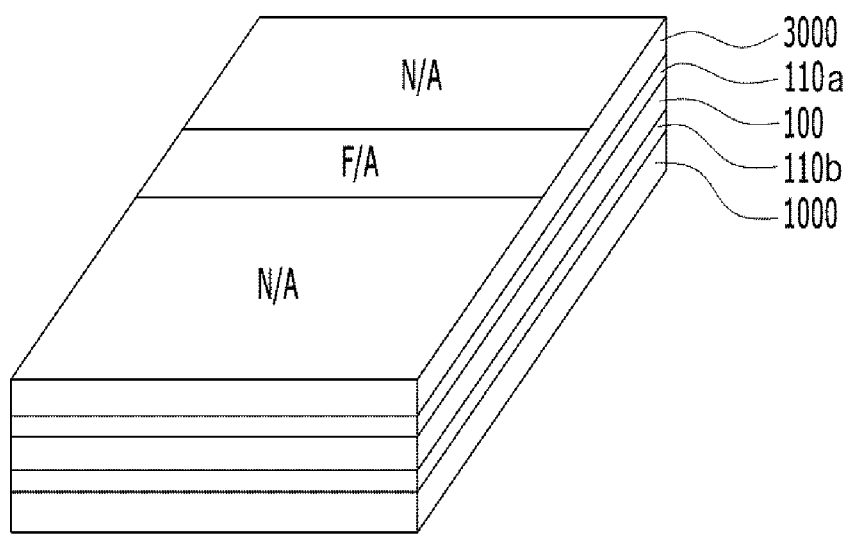
FIG. 6A is a perspective view illustrating a display device according to an embodiment of the present disclosure.
Figure 6B:
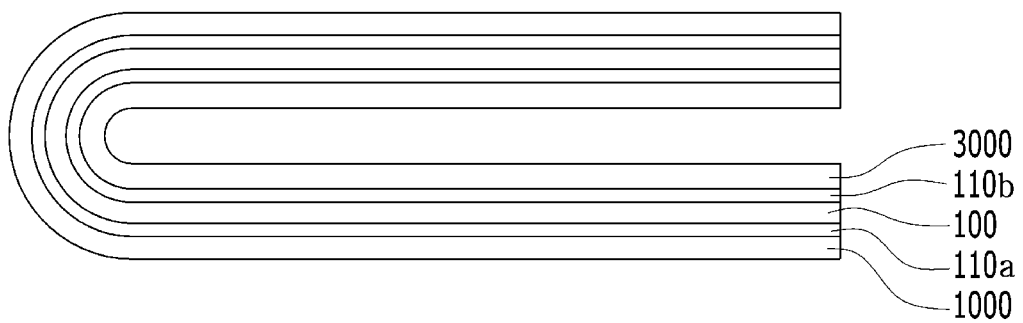
FIG. 6B is a side view illustrating a shape of the display device when the display device is folded when the display device is a foldable display device.

FIG. 6A is a perspective view illustrating a display device according to an embodiment of the present disclosure. FIG. 6B is a side view illustrating a shape of the display device when the display device is folded when the display device is a foldable display device.

A display device according to an embodiment of the present disclosure may include a display panel 100 for displaying images and a back plate 1000 laminated to the rear surface of the display panel 100 via a first adhesive film 110a. A cover window 3000 may be laminated to the front surface of the display panel 100, e.g., the surface of the display panel 100 opposite the surface of the display panel 100 to which the back plate 1000 may be laminated, via a second adhesive film 110b.

The display panel 100 may display images to provide image information to users. The display panel 100 may be flexible. That is, the display panel 100 may be a flexible display panel or a foldable display panel. Consequently, the display device according to an embodiment of the present disclosure may be a foldable display device. When the display panel 100 is a foldable display panel, the display panel 100 may include a folding area F/A, which is foldable. The folding area F/A may be formed to be flexible. When the display panel 100 is a foldable display panel, the display panel 100 may be configured such that only the folding area F/A, which is a portion of the display panel 100, is foldable and non-folding areas N/A may be formed at the remaining portions of the display panel 100. However, embodiments of the present disclosure are not limited thereto. The display panel 100 may be configured such that the entirety of the display panel 100 is flexible.

The cover window 3000 may be laminated to the display panel 100 via the second adhesive film 110b. The area of the cover window 3000 corresponding to the folding area F/A of the display panel 100 is also defined as a folding area F/A. The areas of the cover window 3000 corresponding to the non-folding areas N/A of the display panel 100 are also defined as non-folding areas N/A.

The back plate 1000 may support the display panel 100 at the rear of the display panel 100. The area of the back plate 1000 corresponding to the folding area F/A of the display panel 100 may be a folding area, which is foldable. The areas of the back plate 1000 corresponding to the non-folding areas N/A of the display panel 100 may be formed to exhibit rigidity, whereby the back plate 1000 may support the display panel 100.

The material for the back plate 1000 may not be particularly restricted. For example, the back plate 1000 may be made of metal, silicon resin, and/or various kinds of plastic. The folding area of the back plate 1000 may be flexible. Alternatively, a portion of the folding area of the back plate 1000 may be removed or separated.

As described above, the foldable display device may be configured such that the display panel 100, the cover window 3000, and the back plate 100 may all be foldable. As shown in the example of FIG. 6B, therefore, the display panel 100, the back plate 100, and the cover window 3000 may be folded.

At least one of the first and second adhesive films 110a and 110b may be the same as the adhesive film 110 including the frame 111 having the micro-truss structure and the adhesive 112. The adhesive film 110 has been described previously, and therefore a detailed description thereof will be omitted.

Figure 7:
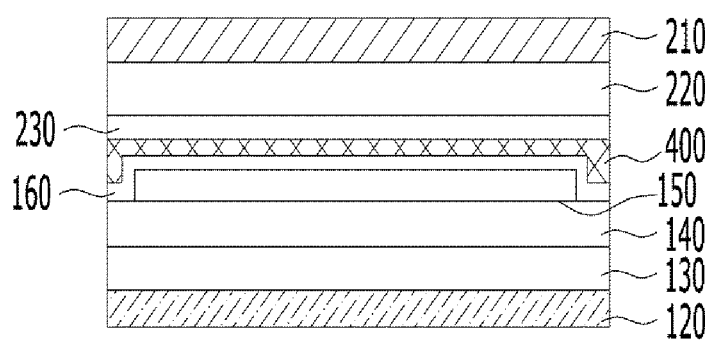
FIG. 7 is a view illustrating a sectional structure of a foldable display panel according to an embodiment of the present disclosure.

FIG. 7 is a view illustrating a sectional structure of a foldable display panel according to an embodiment of the present disclosure.

The display panel 100 may be formed to include a first panel substrate 120, a first buffer layer 130 disposed on the first panel substrate 120, a thin film transistor array 140 disposed on the first buffer layer 130, the thin film transistor array 140 having pixels arranged in the form of a matrix. Each pixel may have a thin film transistor, an organic light-emitting array 150 connected to the thin film transistor of each pixel, a passivation layer 160 disposed to cover the thin film transistor array 140 and the organic light-emitting array 150, excluding a pad unit, a touch electrode array 230 bonded to the passivation layer 160 via a panel bonding layer 400 which is interposed between the touch electrode array 230 and the passivation layer 160, and a second buffer layer 220 and a second panel substrate 210 sequentially formed on the touch electrode array 230. However, embodiments of the present disclosure are not limited thereto, and display panels having various characteristics may be applied depending on the design.

Figure 8:
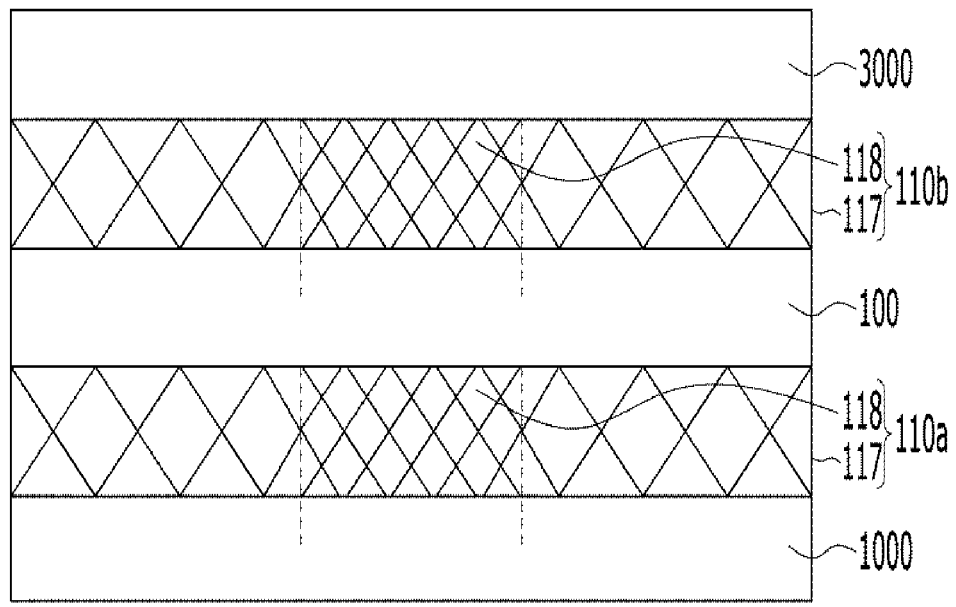
FIGS. 8 and 9 are views illustrating a foldable display device to which an adhesive film including low-density parts and a high-density part has been applied according to an embodiment of the present disclosure.
Figure 9:
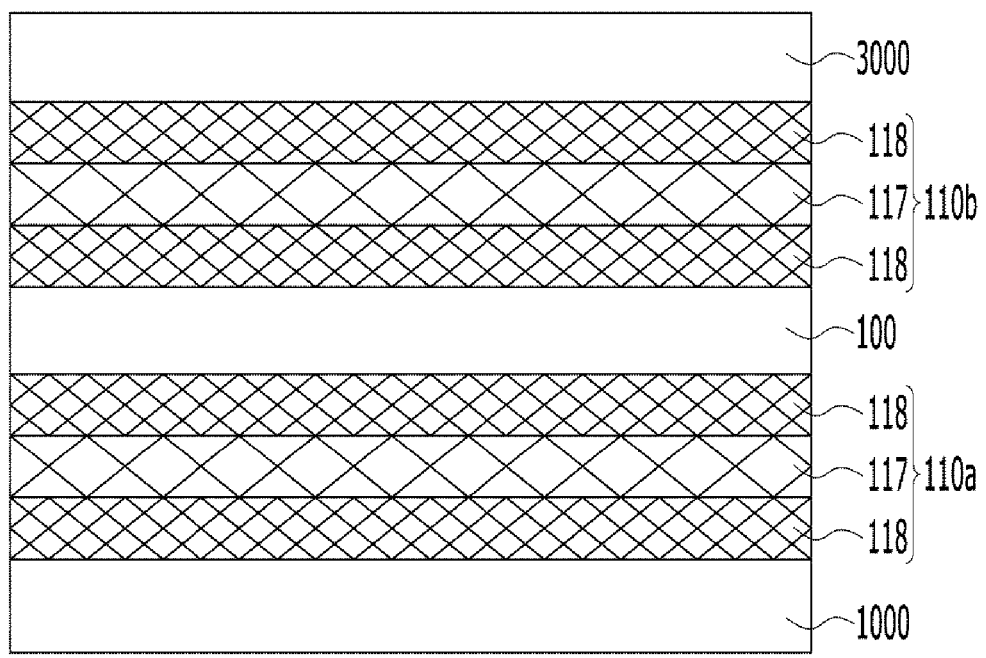

FIGS. 8 and 9 are views illustrating a foldable display device to which an adhesive film including low-density parts and a high-density part has been applied according to an embodiment of the present disclosure.

With reference to the example of FIG. 8, the low-density parts 117 of the adhesive film 110 may be located to correspond to the non-folding areas N/A, and the high-density part 118 of the adhesive film 110 may be located to correspond to the folding area F/A. Because the foldable display device 199 is configured such that the folding area F/A is flexible, the portions of the cover window 300 and the back plate 1000, which may cover the folding area F/A, corresponding to the folding area F/A may be formed to be flexible. As a result, the folding area F/A of the display panel 100 may not be protected by an element that is capable of absorbing shocks. Furthermore, the substrates 120 and 210 of the foldable display panel may be deformed by shocks. Consequently, the shocks may be transmitted to elements in the foldable display panel, whereby the elements in the foldable display panel may become deformed.

To solve this problem, the adhesive film 110 according to an embodiment of the present disclosure may include the high-density part 118, which may be formed at the position corresponding to the folding area F/A of the foldable display panel 100. Consequently, the low shock resistance of the folding area F/A may be remedied.

Meanwhile, because the portions of the cover window 3000 and the back plate 1000 corresponding to the non-folding areas N/A of the foldable display panel 100 may be made of a rigid material, the magnitude of shocks that may be transmitted to the non-folding areas N/A of the foldable display panel 100 may be smaller than that of shock that may be transmitted to the folding area F/A of the foldable display panel 100. Consequently, the low-density parts 117 may be located at the portions of the adhesive film 110 corresponding to the non-folding areas N/A. Alternatively, high-density parts 118 may be located at the portions of the adhesive film 110 corresponding to the non-folding areas N/A.

With reference to the example of FIG. 9, the high-density parts 118 and the low-density part 117 provided in the frame 111 of the adhesive film 110 may be alternately stacked in the vertical direction to serve as a shock absorber for absorbing shocks applied to the foldable display device 100, as shown in the lower portion of the FIG. 3 example. For example, the adhesive film 110 may include high-density parts 118 and a low-density part 117, which may be alternately stacked. Depending on the design, a high-density part 118 may be interposed between low-density parts 117, or high-density parts 118 and low-density parts 117 may be alternately stacked in the vertical direction to form a plurality of layers.

As described above, in the foldable display device according to an embodiment of the present disclosure, the foldable display panel 100 and the cover window 3000 may be laminated, or the foldable display panel 100 and the back light 1000 may be laminated, using the adhesive film 110, which may include the frame 111 having the micro-truss structure and the adhesive 112 filling the frame 111. The frame 111 having the micro-truss structure may exhibit high strength while being lightweight. Furthermore, the frame 111 may be foldable because the frame 111 may be formed to have a micro structure. That is, the adhesive film 110 according to an embodiment of the present disclosure may be formed to be thinner than a related art adhesive film, and may serve as both a shock absorber for absorbing shocks applied to the foldable display device without an additional shock absorber, and as an adhesive for laminating the foldable display panel 100 to another element of the foldable display device. Consequently, the thickness of the foldable display device may be reduced. Additionally, in the foldable display device according to an embodiment of the present disclosure, the shock resistance of the foldable display device may be improved, while the foldability of the foldable display device is not deteriorated because the foldable display device includes the adhesive film 110.

As is apparent from the above description, the frame having the micro-truss structure, which is included in the adhesive film according to an embodiment of the present disclosure, may exhibit high strength while being lightweight. Furthermore, the frame is foldable because the frame is formed to have a micro structure. That is, the adhesive film according to an embodiment of the present disclosure may be formed to be thinner than a related art adhesive film, and may serve as both a shock absorber for absorbing shocks applied to the foldable display device without an additional shock absorber, and as an adhesive for laminating the foldable display panel to another element of the foldable display device. Consequently, the thickness of the foldable display device may be reduced. Additionally, in the foldable display device according to an embodiment of the present disclosure, the shock resistance of the foldable display device may be improved, while the folding characteristics of the foldable display device are not deteriorated because the foldable display device includes the adhesive film.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. An adhesive film, comprising:
   a frame comprising a micro-truss structure, the micro-truss structure comprising a plurality of unit cells comprising a plurality of wires intersecting each other in a three-dimensional space; and
   an adhesive filling the frame,
   wherein the frame further comprises one of:
      an arrangement of the unit cells in a horizontal direction, and
      an arrangement of the unit cells in the horizontal direction with the unit cells stacked in a vertical direction, and
   wherein the frame further comprises:
      a high-density part; and
      a low-density part.

2. The adhesive film of claim 1, wherein each of the unit cells comprises a structure comprising one of: a pyramid truss structure, a Kagome truss structure, and an octet truss structure.

3. The adhesive film of claim 1, wherein a number of the unit cells per unit volume in the high-density part is greater than a number of the unit cells per unit volume in the low-density part.

4. The adhesive film of claim 3, wherein the high-density part extends from the low-density part in the horizontal direction.

5. The adhesive film of claim 3, wherein at least one high-density layer comprising the high-density part and at least one low-density layer comprising the low-density part are alternately stacked.

6. A foldable display device, comprising:
   a display panel comprising:
      at least one folding area; and
      at least one non-folding area;
   a cover window laminated to an upper side of the display panel;
   a back plate laminated to a lower side of the display panel;
   a first adhesive film laminating the display panel to the back plate; and
   a second adhesive film laminating the display panel to the cover window,
   wherein at least one of the first and second adhesive films comprises:
      a frame comprising a micro-truss structure, the micro-truss structure comprising a plurality of unit cells comprising a plurality of wires intersecting each other in a three-dimensional space, and
      an adhesive filling the frame,
      wherein the frame further comprises one of:
         an arrangement of the unit cells in a horizontal direction, and
         an arrangement of the unit cells in the horizontal direction with the unit cells stacked in a vertical direction, and
      wherein the frame further comprises:
         a high-density part; and
         a low-density part.

7. The foldable display device of claim 6, wherein each of the unit cells comprises a structure comprising one of: a pyramid truss structure, a Kagome truss structure, and an octet truss structure.

8. The foldable display device of claim 6, wherein the number of the unit cells per unit volume in the high-density part is greater than the number of the unit cells per unit volume in the low-density part.

9. The foldable display device of claim 8, wherein the high-density part is disposed to correspond to a rear surface of the folding area.

10. The foldable display device of claim 8, wherein the frame further comprises:
    at least one high-density layer comprising the high-density part; and
    at least one low-density layer comprising the low-density part,
    wherein the at least one high-density layer and the at least one low-density layer are alternately stacked.

11. A method of manufacturing a foldable display device, the method comprising:
    providing a display panel comprising:
       providing at least one folding area; and
       providing at least one non-folding area;
    laminating a back plate to a lower side of the display panel with a first adhesive film;
    laminating a cover window to an upper side of the display panel with a second adhesive film;
    wherein at least one of the first and second adhesive films comprises:
       a frame comprising a micro-truss structure, the micro-truss structure being comprising a plurality of unit cells formed by a plurality of wires intersecting each other in a three-dimensional space, and
       an adhesive filling the frame,
       wherein the frame is formed by arranging the unit cells in a horizontal direction or by arranging the unit cells in the horizontal direction while stacking the unit cells in a vertical direction, and
       wherein the forming the frame comprises:
          providing a high-density part, and
          providing a low-density part.

12. The method of claim 11, wherein each of the unit cells comprises a structure comprising one of: a pyramid truss structure, a Kagome truss structure, and an octet truss structure.

13. The method of claim 11, wherein the number of the unit cells per unit volume in the high-density part is greater than the number of the unit cells per unit volume in the low-density part.

14. The method of claim 13, wherein the high-density part is disposed to correspond to a rear surface of the folding area.

15. The method of claim 13, wherein the forming the frame further comprises alternately stacking at least one high-density layer comprising the high-density part and at least one low-density layer comprising the low-density part.

* * * * *